(12) United States Patent
Menkhoff

(10) Patent No.: US 9,344,111 B2
(45) Date of Patent: May 17, 2016

(54) N-ORDER NOISE SHAPER

(71) Applicant: Intel Mobile Communications GmbH, Neubiberg (DE)

(72) Inventor: Andreas Menkhoff, Oberhaching (DE)

(73) Assignee: Intel Deutschland GmbH, Neubiberg (DE)

( * ) Notice: Subject to any disclaimer, the term of this patent is extended or adjusted under 35 U.S.C. 154(b) by 371 days.

(21) Appl. No.: 13/930,060

(22) Filed: Jun. 28, 2013

(65) Prior Publication Data

US 2015/0003502 A1 Jan. 1, 2015

(51) Int. Cl.
*H03M 3/00* (2006.01)
*H03H 17/00* (2006.01)

(52) U.S. Cl.
CPC .............. *H03M 3/438* (2013.01); *H03H 17/00* (2013.01); *H03M 3/50* (2013.01)

(58) Field of Classification Search
None
See application file for complete search history.

(56) References Cited

U.S. PATENT DOCUMENTS

| | | | | | |
|---|---|---|---|---|---|
| 4,672,633 | A | * | 6/1987 | Claasen | H04B 1/62 375/263 |
| 4,945,359 | A | * | 7/1990 | Yamakido | H03M 3/418 341/122 |
| 5,191,334 | A | * | 3/1993 | Yasuda | H03H 17/0664 341/50 |
| 5,583,501 | A | * | 12/1996 | Henrion | H03M 1/1042 341/118 |
| 6,177,896 | B1 | * | 1/2001 | Min | H03M 3/504 341/143 |

* cited by examiner

*Primary Examiner* — Michael D Yaary
(74) *Attorney, Agent, or Firm* — Eschweiler & Associates, LLC

(57) ABSTRACT

An n-order noise shaper has an order $n \geq 3$, wherein a first set of polynomial coefficients are optimized with respect to a useful band and wherein a second set of polynomial coefficients are optimized with respect to an optimization aim depending on an overall out of band noise and/or on a maximum out of band noise.

15 Claims, 11 Drawing Sheets

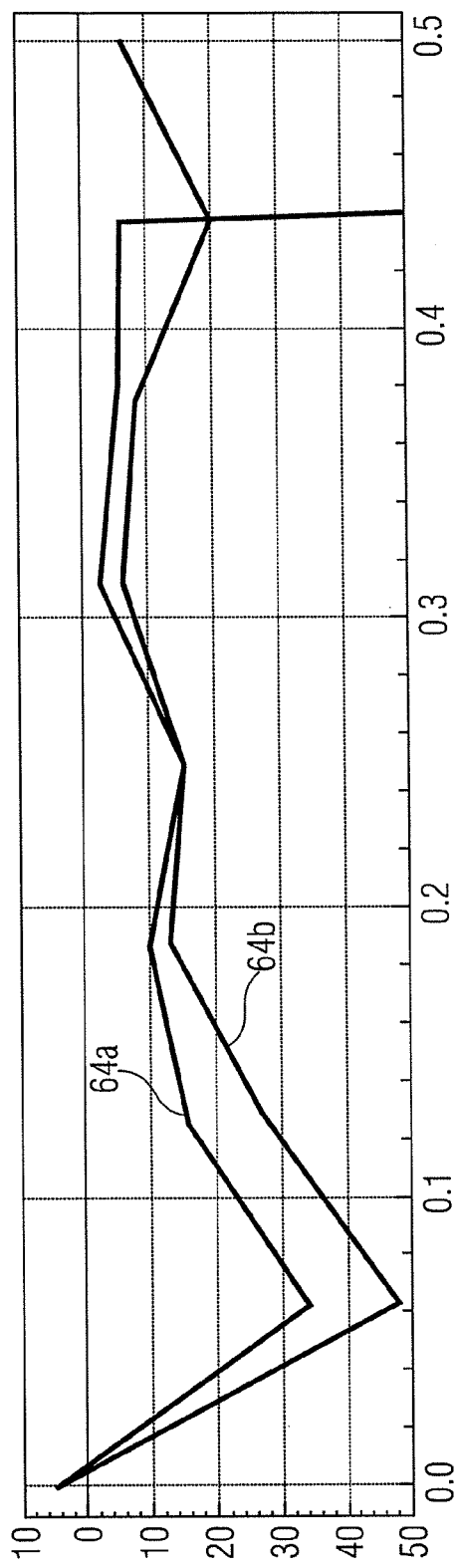

N-ORDER NOISE SHAPER

FIELD

Implementations of the present invention refer to an n-order noise shaper, to a digital filter, a mobile communication device performing a mobile communication using an n-order noise shaper and to a method for optimizing a transmission function of a noise shaper.

BACKGROUND

Noise shaping is a method enabling increasing the apparent signal to noise ratio (SNR) of the resultant signal. In detail, the spectral shape of a signal is changed such that the noise power is reduced to lower levels in frequency bands where noise is perceived to be more undesirable and correspondingly increased in frequency bands in which the noise is perceived to be less undesirable. The background of such noise shapers is the well-known Nyquist theorem stating that for real signals the sampling rate should be at least twice as high as the highest signal frequency. Therefore, the frequency half of the sampling frequency is often called the Nyquist frequency. In a lot of situations the actually used sampling frequency is much higher than the Nyquist frequency. This provides some freedom which may be used for noise shaping. Expressed in other words, this means that the quantization noise inside the wanted frequency range is reduced for the price that the noise outside this frequency range is increased to higher values.

SUMMARY

According to a first implementation of the present invention an n-order noise shaper has an order $n \geq 3$. Here, a first set of polynomial coefficients are optimized with respect to a useful band, wherein a second set of polynomial coefficients are optimized with respect to an optimization aim depending on an overall out of band noise and/or on a maximum out of band noise.

According to a further implementation, a mobile communication device is configured to perform a mobile communication using a signal processor of a transmitter and using an n-order noise shaper. Here, the n-order noise shaper has a transmission function $H(z)=\Sigma_{i=1}^{n} a_i z^{-i+1}$. The first polynomial coefficient $a_1$ and/or the second polynomial coefficient $a_2$ are optimized with respect to a useful band, wherein one or more further polynomial coefficients (e.g. $a_3$ or $a_4$) are optimized with respect to an optimization aim depending on an overall out of band noise and/or on a maximum out of band noise. Furthermore, the signal processor is coupled to a digital to analog converter or comprises a digital to analog converter.

According to a further implementation, a digital filter has a transmission function $H(z)=\Sigma_{i=1}^{n} a_i z^{-i+1}$. The first polynomial coefficient $a_1$ and/or the second polynomial coefficient $a_2$ are optimized with respect to a useful band, wherein one or more further polynomial coefficients (e.g., $a_3$ or $a_4$) are optimized with respect to an optimization aim depending on an overall out of band noise and/or on a maximum out of band noise.

A further implementation provides a method for optimizing a transmission function $H(z)=\Sigma_{i=1}^{n} a_i z^{-i+1}$ of a noise shaper. The method comprises electing a first polynomial coefficient $a_1$ and a second polynomial coefficient $a_2$ with respect to a useful band and electing one or more further polynomial coefficients with respect to an optimization aim depending on an overall out of band noise and/or on a maximum out of band noise.

A further implementation provides a computer readable digital storage medium having stored thereon a computer program having a program code for performing, when running on a computer, a method for optimizing a transmission function $H(z)=\Sigma_{i=1}^{n} a_i z^{-i+1}$ of a noise shaper. The method comprises electing a first polynomial coefficient $a_1$ and/or a second polynomial coefficient $a_2$ with respect to a useful band and electing one or more further polynomial coefficients with respect to an optimization aim depending on an overall out of band noise and/or on a maximum out of band noise.

BRIEF DESCRIPTION OF THE DRAWINGS

Implementations of the present invention will subsequently be discussed referring to the enclosed figures, wherein:

FIG. 5 shows a diagram comprising Fourier-transformed noise pattern for illustrating the improvement due to the optimization method for transmission functions of noise shapers.

DETAILED DESCRIPTION

Figure 1A:
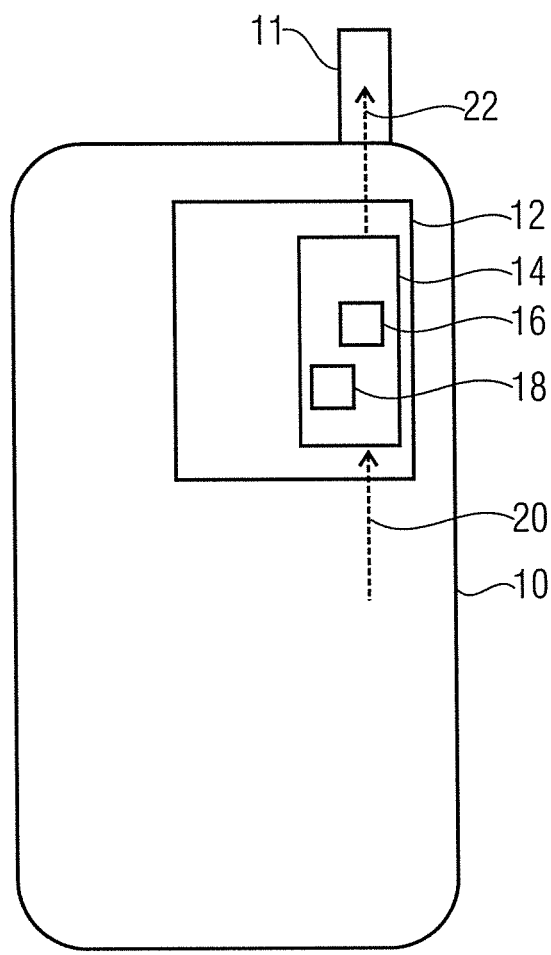
FIG. 1*a* shows a schematic block diagram of a mobile communication device comprising a transceiver having a noise shaper.

Different implementations of teachings disclosed herein are discussed referring to FIGS. 1 to 6 below. Identical reference numerals are provided to objects having identical or similar functions so that objects referred to by identical reference numerals within different implementations are interchangeable and the description thereof is mutually applicable.

FIG. 1*a* shows a mobile communication device 10, e.g., a mobile phone or smartphone, comprising an antenna 11 and a transceiver 12. The transceiver 12 may comprise a transmitter unit 14 and/or a receiver unit (not shown), wherein the below discussion is made on the assumption that the transceiver 12 comprises at least the transmitter unit 14. The transmitter unit 14 may comprise a signal processor like a digital to analog converter 16 and a filter 18, for example a digital filter having the purpose of noise shaping. Thus, in the bellow discussion the digital filter 18 is referred to as feedback filter 18. Furthermore, the transmitter 14 may comprise further circuit units, e.g. a modulator (not shown).

Below, the functionality of the communication device 10 will be discussed. The communication device 10 is configured to perform a mobile communication comprising transmitting and receiving communication data. Here, the transmission is illustrated. The data 20 to be transmitted is provided by a baseband processor (not shown) in the digital domain. This digital data 20 is processed via the transmitter 14, i.e. filtered by the feedback filter 18, converted into the analog domain by the digital to analog converter 16 and/or modulated onto a carrier by using the modulator, in order to be output as HF signal 22 via the antenna 11.

The discussion below relates to noise shaping and omits some details of the digital to analog converter or the modulator in order to facilitate understanding of the noise shaping. In the interests of simplification, the functionality of the digital noise shaper will be discussed referring to a simpler example of filtering audio signals.

In this example, the audio signals are processed by using a Sigma Delta data converter. The audio signal has a frequency which is typically smaller than 20 kHz, wherein the sampling frequency is selected such that same is higher or even much higher when compared to the frequency of the audio signal. For example, the sampling frequency may be 20 MHz, i.e. 1000 times higher than the audio frequency. Thus, digital to analog converters 16 (as well as analog to digital converters) are built up as noise shaped data converters. With one bit at 20 MHz you can achieve more than 100 dB SNR inside the audio frequency range. The situation is especially quite comfortable for the audio analog to digital converters: You get a one bit input signal at some MHz sampling frequency with shifted noise from audio range to the MHz sampling domain, then the artificial introduced quantization noise is filtered out by the digital decimation filter and afterwards a high quality audio signal remains. The word "noise shaping" sounds like noise is shaped from one frequency range to another frequency range. However, due to the shaping operation the overall noise gets highly amplified. For example, for classical 3-, 4-, 5-order Sigma Delta converters the overall noise energy is amplified by a factor 20, 70, 252; i.e., the overall noise is the more amplified the higher the order of the noise shaper. To summarize, the noise is reduced within the useful band, wherein the noise is disproportionally amplified within the out-of-band-frequency-range. It is a common approach to combine such noise shapers with a lowpass filter to filter out the additional noise generated by the noise shaper, as illustrated by FIG. 1b.

Figure 1B:
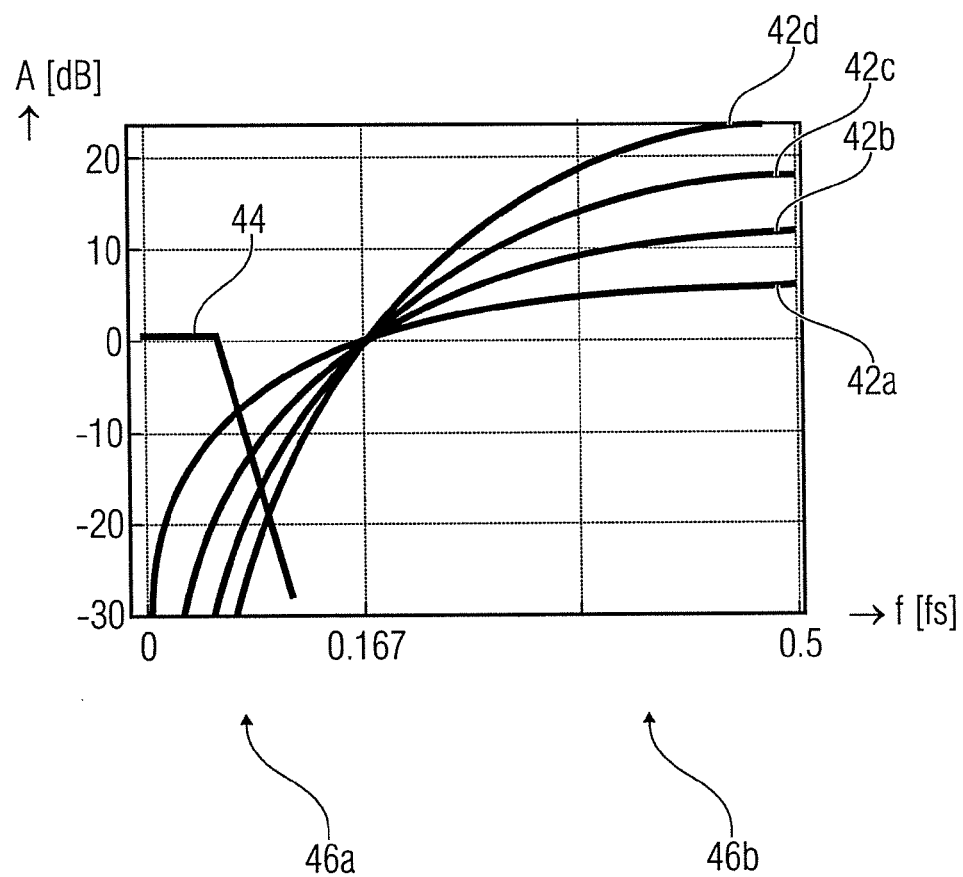
FIG. 1*b* shows a diagram comprising a plurality of transmission functions for illustrating the difference between a transmission function of a noise shaper of a lower order and of a transmission function of a noise shaper of a higher order.

FIG. 1b shows a diagram of the noise amplification A in dB (y-axis) for four different classical noise shapers. The first transfer function 42a belongs to a noise shaper $1^{st}$ order, the second transfer function 42b to a noise shaper $2^{nd}$ order, the third transfer function 42c to a noise shaper $3^{rd}$ order and the fourth transfer function 42d to a noise shaper $4^{th}$ order. Furthermore, the diagram shows the transfer function 44 for a lowpass filter for filtering out the noise generated by the different noise shapers.

As can be seen by the diagram, the characteristic of the transfer functions 42a to 42d varies dependent on the respective order within the frequency range of the wanted band 46a. When comparing the transfer function 42a to the transfer function 42d it is clearly provided that a filter of a higher order (cf. 42d) generates more noise energy (especially within the out-of-band-frequency-range 46b). For example, the $4^{th}$ order noise shaper generates 252 times more quantization noise than a filter of a first order (cf. 42a). This out of band noise may be filtered out by the lowpass filter having the filter characteristic 44. This is not optimal from an energy point of view. If this noise is not wanted, it would be better to ensure that this noise is not generated. Especially at lower output power the noise power (cf. 46b) of a higher order noise shaper (cf. transfer function 42d) is higher than the wanted signal power (cf. 46b). To summarize, this means that the signal will be amplified inside the data converter and the next step will be eliminated. Further, Analog lowpass filters have a further drawback in regard to the chip space consumption.

In some applications, it is not possible to apply an external lowpass due to the above reasons. Especially in mobile communication applications it is a common goal to get rid of external analog filters. Thus, practical noise shapers for systems without external lowpass, i.e. for a transceiver 12 of a mobile communication device 10 or, in more detail, for the analog section of the transceiver 12, are limited to $1^{st}$ or $2^{nd}$ order. $2^{nd}$ order noise shapers are only taken if a scrambling of a quantization pattern is more important than low out of band noise. However, the use of noise shapers having a higher order may beneficial. Therefore, there is the need for an improved approach, which will be discussed below.

The n-order noise shaper according to the improved approach has an order n, with n≥3. The n-order noise shaper is designed according to a transmission function $H(z)=\Sigma_{i=1}^{n} a_i z^{-i+1}$, where $a_i$ are the polynomial coefficients. The first set of polynomial coefficients are optimized with respect to the useful band 46a, wherein the second set of polynomial coefficients are optimized with respect to an optimization aim depending on an overall out of band noise and/or on a maximum out of band noise (cf. 46b). This enables designing a transfer function which is adapted within the useful band 46a as well as adapted in the out of band range 46b. For example, a transfer function may be desired which reduces or limits the out of band noise. Further, this way of designing the transfer function enables that same may have an integrated lowpass to attenuate the high frequency components, if for example a noise shaping close to DC is wanted. With respect to FIG. 2, different optimization variants will be discussed.

Figure 2A:
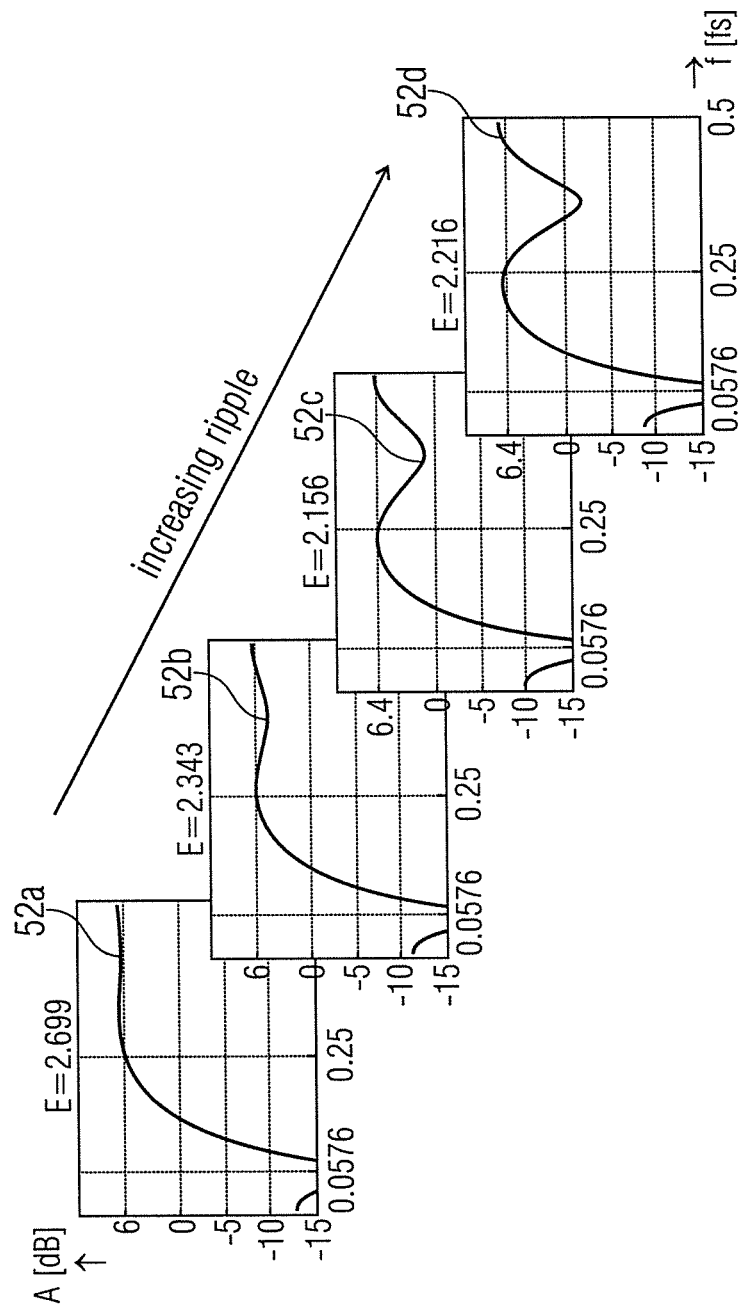
FIG. 2*a* shows four diagrams for illustrating different transmission functions of an n-order noise shaper with an order n=4.

FIG. 2a shows four diagrams of a transfer function of a $4^{th}$ order noise shaper. In general, each transfer function 52a, 52b, 52c and 52d has a minimum attenuation A at the certain frequency f, here at 0.0576 fs, and a maximum or a plurality of maxima at the out of band range, here between 0.1 to 0.5 fs.

The $4^{th}$ order noise shaper has four degrees of freedom. Two degrees and two polynomial coefficients $a_1$ and $a_2$, respectively, are taken to form the wanted perfect noise shaping. The other two polynomial coefficients $a_3$ and $a_4$ (degrees of freedom) are taken to reduce the out of band error E. As illustrated by the four diagrams, the out of band error E is reduced from the transfer function of 52a (cf. value of the out of band error E=2.699) to the transfer functions 52c or 52d (error values E=2.156 and 2.216). To minimize or mitigate the error E a chebyshev behavior of the out of band noise shows the best results. Two optima exist close together: the first optimum reduces the overall out of band noise (to a value of 2.156) which belongs to the transfer function 52c. The second optimum limits the maximum out of band noise to 6.0 dB (cf. transfer function 52b). Thus, the adaption of the transfer function by varying the second set of polynomial coefficients (here: $a_3$ and $a_4$) enables optimizing the transfer functions to two different optimization aims, namely to a reduced overall out of band noise E (cf. transfer function 52c) or to a limited maximum out of band noise (cf. transfer function 52b). In practice there may be a deviation of the chebyshev behavior due to the quantization of the coefficients.

Figure 2B:
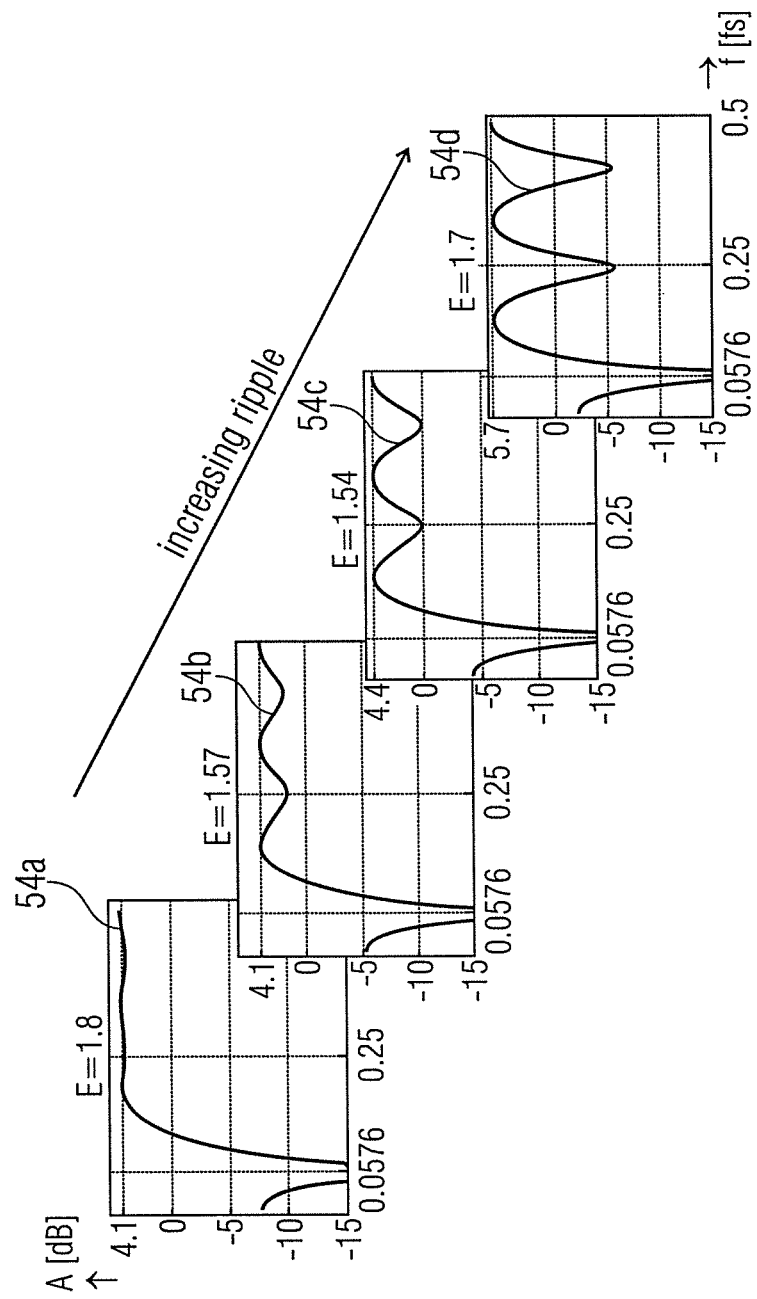
FIG. 2*b* shows four diagrams for illustrating different transmission functions of an n-order noise shaper with an order n=6.

In order to reduce the out of band noise further, a noise shaper having an order of 6 may be used, as illustrated by FIG. 2b. FIG. 2b shows four diagrams for the four different transfer functions 54a to 54d. The transfer functions 54a, 54b, 54c and 54d are substantially similar to the transfer function 52a, 52b, 52c and 52d.

As discussed with respect to FIG. 2a, just the second set of polynomial coefficients, comprising the polynomial coefficients $a_3$, $a_4$, $a_5$ and $a_6$, are varied. The first set of polynomial coefficients comprising the polynomial coefficients $a_1$ and $a_2$ are selected such that the wanted perfect noise shaping is achieved, here at 0.0576 fs. As discussed with respect to FIG. 2a the second set of polynomial coefficients describing the other four degrees of freedom and comprising the other four polynomial coefficients $a_3$, $a_4$, $a_5$ and $a_6$ are selected in order to reduce the overall out of band error E (cf. transfer function 54c, value for the error E=1.54) or to limit the maximum out of band noise (cf. transfer function 54b, value for the maximum out of band noise 4.1 db).

The comparison of the $2^{nd}$ order, $4^{th}$ order and $6^{th}$ order noise shapers shows that with increased filter order, the out of band noise is decreased from a factor 6 to a factor 2.156 or to a factor 1.54 times the rounded signal (without any noise shaping). The maximum out of band noise is decreased from 12 dB to 6 dB ($4^{th}$ order) or 4.1 dB ($6^{th}$ order). As is shown by the diagrams of FIG. 2a and the diagrams of FIG. 2b the characteristic of the transfer function, especially in the out of band range, is significantly influenced by the varied second set of polynomial coefficients. The characteristic change (from 52a to 52d or from 54a to 54d) shows the increasing of ripple.

Figure 3A:
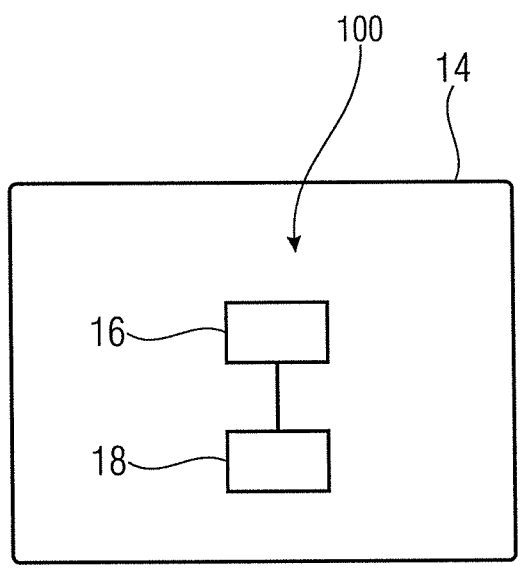
FIG. 3*a* shows a schematic block diagram of a basic implementation of an n-order noise shaper.

An n-order noise shaper (n>2) designed according to the improved approach discussed with respect to FIGS. 2a and 2b is shown by FIG. 3a. FIG. 3a shows a noise shaping circuit 100, here implemented into a signal processing unit, for example into a transmitter 14 (cf. FIG. 1a). The noise shaper 100 comprises the signal processor 16, for example, a digital to analog converter (DAC), and the feedback filter 18 which is coupled to the signal processor 16. Typically, the feedback filter 18 is coupled to the signal processor 16 as a feedback loop.

Consequently, the filter function (transfer function) is realized by the combination of the signal processor 16 and the feedback filter 18. The feedback filter 18 may comprise a filter processor or may be formed by a filter processor which, vice versa, comprises, for example, a CPU and is configured to execute an algorithms according to the transfer function $H(z)= \sum_{i=1}^{n} a_i z^{-i+1}$. This means that the transfer function $H(z)=\sum_{i=1}^{n} a_i z^{-i+1}$ is mainly determined by the feedback filter 18 or, from another point of view, that the a function is applied to the feedback filter 18 such that the wanted transfer function $H(z)=\sum_{i=1}^{n} a_i z^{-i+1}$ is formed by the combination of the signal processor 16 and the feedback filter 18. By proper designing the transfer function $H(z)=\sum_{i=1}^{n} a_i z^{-i+1}$ or by proper selection the first or especially the second set of polynomial coefficients it can be achieved that that an increased noise shaper filter order can be used to reduce the out of band energy so that no subsequent analog lowpass filter is necessary. It should be noted that the above discussed noise shaping circuit 100 may also be implemented into other circuits, for example into a receiver, a transceiver, a transceiver of a mobile communication device or another signal processor, for example signal processor of an audio device.

Figure 2C:
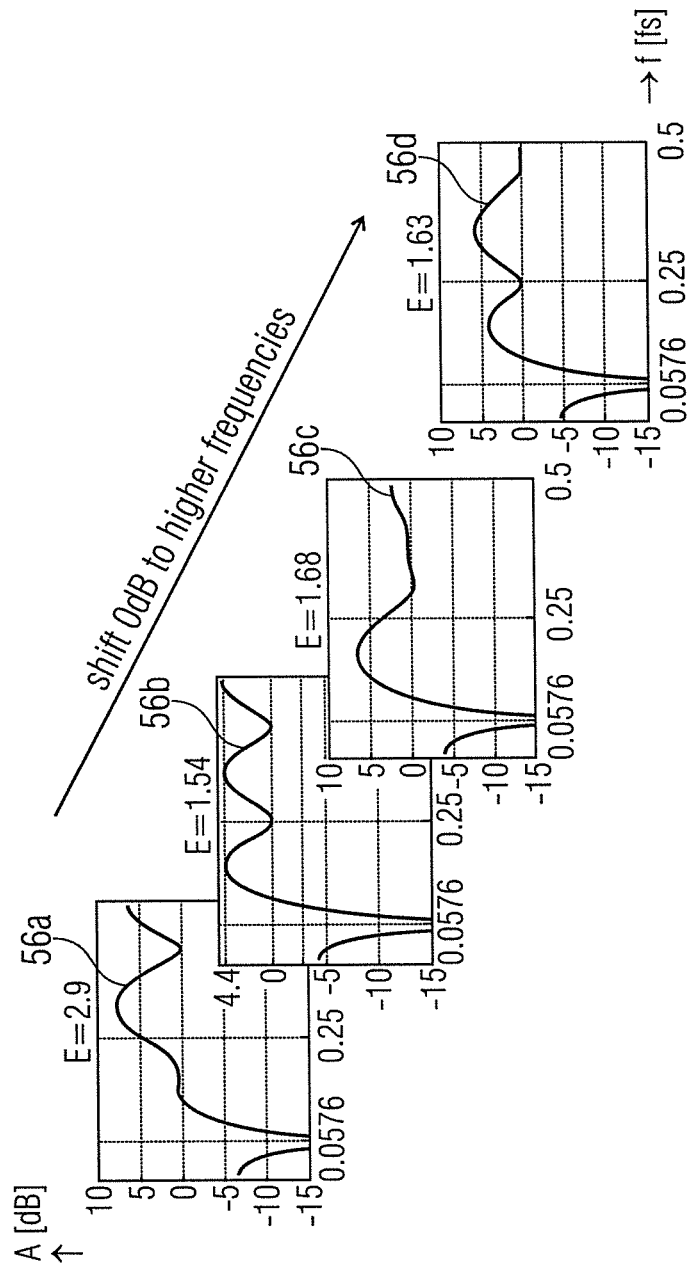
FIG. 2*c* shows four diagrams for illustrating different transmission functions of an n-order noise shaper with an order n=6, wherein an additional attenuation is applied to the transmission function.

FIG. 2c shows four further diagrams illustrating further transfer functions 56a, 56b, 56c and 56d. The transfer functions 56a, 56b, 56c and 56d are, at least in the wanted band, similar to the above discussed transfer functions 52a to 52d and 54a to 54d.

Here, the noise shaping is done at duplexer distance close to DC in order to not disturb receive signals with the transmit signal. Therefore, there is an additional attenuation of 0 dB applied to a certain frequency range (for example, at 0.1 to 0.5 fs). For example, this additional attenuation may be used for the cases if a further signal, for example a GPS signal (at 1535 MHz) or a Bluetooth or WLAN signal (between 2402 MHz and 2480 MHz) is present. These frequency ranges are overlapping to the out-of-band-frequency-range between 0.1 and 0.5 fs in which the generation of additional noise should be avoided. The four different transfer functions 56a, 56b, 56c and 56d differ from each other due to the fact that the additional 0 dB attenuation point is shifted over the whole frequency range from 0.1 fs to 0.5 fs. In general, that means that the transfer function or the second set of polynomial coefficients may be selected such that an additional filter function (like an additional attenuation) is realized. With respect to FIGS. 3a to 3d, different implementations of noise shapers having a transfer function according to the above discussed principles will be discussed.

Figure 3B:
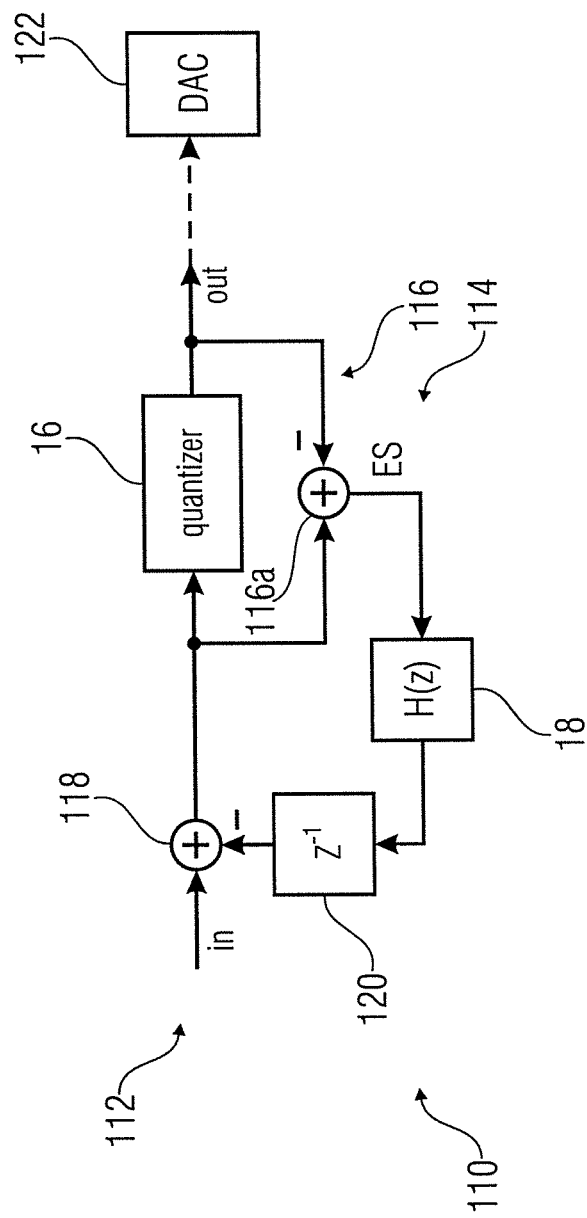
FIG. 3*b* shows a schematic block diagram of an enhanced implementation of an n-order noise shaper.

FIG. 3b shows a noise shaping circuit 110, which may be implemented into a transmitter or a receiver. The noise shaper 110 comprises the feedback filter 18 which is arranged in a feedback loop 114 in parallel to the signal path 112 comprising the signal processor 16. Here, the signal processor 16 is formed by a quantizer. The feedback filter 18 may be formed by a FIR-filter or a filter processor and may accommodate the transfer function H(z). The feedback loop 114 is coupled via a comparator arrangement 116 to the input and the output of the signal processor 16. The feedback loop 114 is further coupled to the input of the signal path 112 via a signal coupler 118, for example, via another summation element.

The signal path 112 is configured to output a signal, for example a communication signal based on the input signal and/or to process the signal by using the signal processor 16. The error caused by the signal processor 16 is measured by using the comparator arrangement 116 which may comprise a summation element 116a. The summation point 116a has the purpose to indicate a signal deviation between the input and the output signal of the signal processor 16 by using the ES signal. Therefore, the summation element 116a may be configured to perform a summation operation or a subtraction operation. The comparator arrangement 116 is configured to output an error signal ES indicating the signal difference (signal deviation) between the input and the output of the signal processor 16. The transfer function H(z) implemented into the feedback filter 18 is dependent on the error signal ES. The transfer function from output to input may be described by the following formula:

$$ES=-Out+In-z \cdot H(z) \cdot ES$$

$$Out=In-ES-z^{-1} \cdot H(z) \cdot ES$$

$$Out=In-ES \cdot (1+z^{-1} \cdot H(z))$$

The error signal ES itself is usually white. By weighting H(z) it gets colored. For example, the transfer function 54b (cf. FIG. 2b) is worded as follows:

$$H(z)=-0.616205179173-0.2959712477896*z^{-1}-0.058836284443*z^{-2}+0.0927110489356*z^{-3}+0.162876292237*z^{-4}+0.261314193721*z^{-5}$$

It is noticeable that the coefficients $a_1$ to $a_6$ are very small. This is a pure digital noise shaper, where the number of output bits is less than the number of input bits. According to the noise shaper function H(z) the input signal of the signal path 112 is changed by using the coupler element 118 so that the wished transfer function from the input to the output of the signal path 112 is achieved.

According to further implementations, the noise shaper 110 may comprise optional elements, like the delay element 120 within the feedback loop 114. The delay element 120 ($z^{-1}$) is arranged between the feedback filter 18 and the summation element 118, but may alternatively be integrated into the feedback filter 18. Furthermore, the noise shaping circuit 110 may be coupled to an optional digital to analog converter 122 or to a further signal processor via the output of the signal path 112, for example, to 122 a digital to time converter (DTC, instead of the digital to analog converter).

Figure 3C:
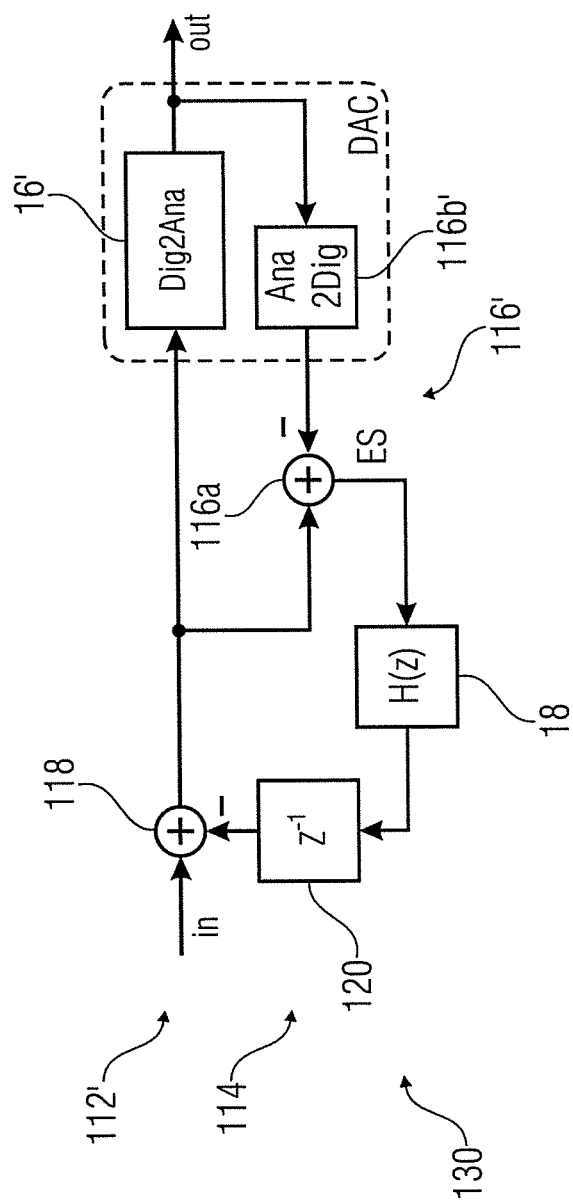
FIG. 3*c* shows a schematic block diagram of an implementation of an n-order noise shaper applied to a circuit comprising a digital to analog converter.

FIG. 3c shows a further noise shaper 130 comprising the feedback loop 114 and the signal path 112'. Here, the signal path 112' comprises a digital to analog converter 16' instead of the signal processor 16. Further, the comparator arrangement 116' comprises an additional analog to digital converter 116b', which is coupled to the digital output of the digital to analog converter 16', i.e. arranged between the output of the digital to analog converter 16' and summation element 116a so that the remaining analog resolution error inside the digital to analog converter 16' is measured with the digital to analog converter 116b' and then fed back inside the digital noise shaping circuit 120. This circuit 120 is useful when the main noise of the digital to analog circuit 16' is generated by thermal noise and would, thus, smear any transfer zeroes which may be generated by a circuit like the circuit 110. Just for the sake of completeness, it should be noted that the shown noise shaper 120 also comprises the feedback filter 18 accomplishing the improved designed filter function H(z), the summation element 118 as well as the optional delay element 120.

Figure 3D:
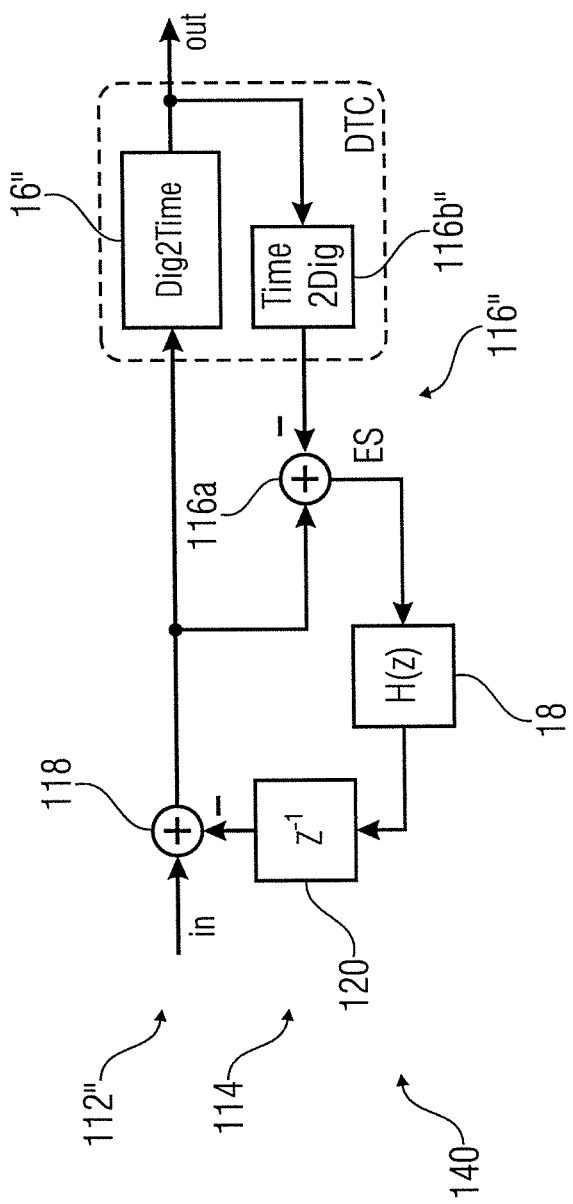
FIG. 3*d* shows a schematic block diagram of an implementation of an n-order noise shaper applied to a circuit comprising a digital to time converter.

FIG. 3d shows a further noise shaper 140 comprising a digital to time converter 16" within the signal path 112" as signal processor. Here, the feedback loop 114 remains unchanged, wherein the comparator arrangement 116" comprises a time to digital converter 116b" arranged between the summation element 116a and the output of the digital to time converter 16" such that the remaining time resolution error inside the digital to time converter 16" is measured by using the time to digital converter 116b" and then fed back inside the digital noise shaping circuit 140. This circuit 140 is again useful when the main noise of the digital to time circuit 16" is generated thermal noise and would thus smear any transfer zeroes.

Another example illustrates the benefit of digital noise shapers having a transfer function design according to the improved design method. In the case of using small rational numbers, the period length of a $1^{st}$ order noise shaper is quite small. Below, the transfer functions for a $1^{st}$ order noise shaper, a $2^{nd}$ order noise shaper and a $3^{rd}$ order noise shaper enabling to shape the critical signals 7/8 will be discussed:

With a $1^{st}$ order noise shaper the periodic noise sequence is $\{1, 1, 1, 1, 1, 1, 1, 0\}$, i.e. from eight numbers seven are ones and one is zero. The mean is 7/8 and the variance 8/64. Unfortunately, the period length is only eight, thus this short period length leads to dedicated harmonics in the spectrum. With a $2^{nd}$ order noise shaper $H(z)=-2+z^{-1}$ the periodic noise sequence is $\{2, 0, 0, 2, 1, 0, 2, 0, 1, 1, 1, 1, 0, 2, 0, 1\}$. The mean is 7/8 and the variance increased to 39/60. Now the period length is 16, thus this period length leads to lower harmonics in the spectrum.

With a $3^{rd}$ order noise shaper according to the above teachings $H(z)=-1.5+0\cdot z^{-1}+0.5\cdot z^{-2}$ the periodic noise sequence is $\{2, 0, 1, 1, 0, 1, 2, 0, 1, 1, 1, 1, 1, 0, 1, 1\}$. The mean is 7/8 and the variance decreased to 23/60. Now the period length is 16, thus this period length leads to the lowest harmonics in the spectrum due to long period and smallest variance. In general, the variance according to the noise shaper is half the variance of the $2^{nd}$ order noise shaper: $(1.5^2+0.52^2)/(2^2+1^2)=0.5$. The variance could be further decreased and the period length could be further increased, if the order of the noise shaper would be increased according to the above design principles.

Figure 4:
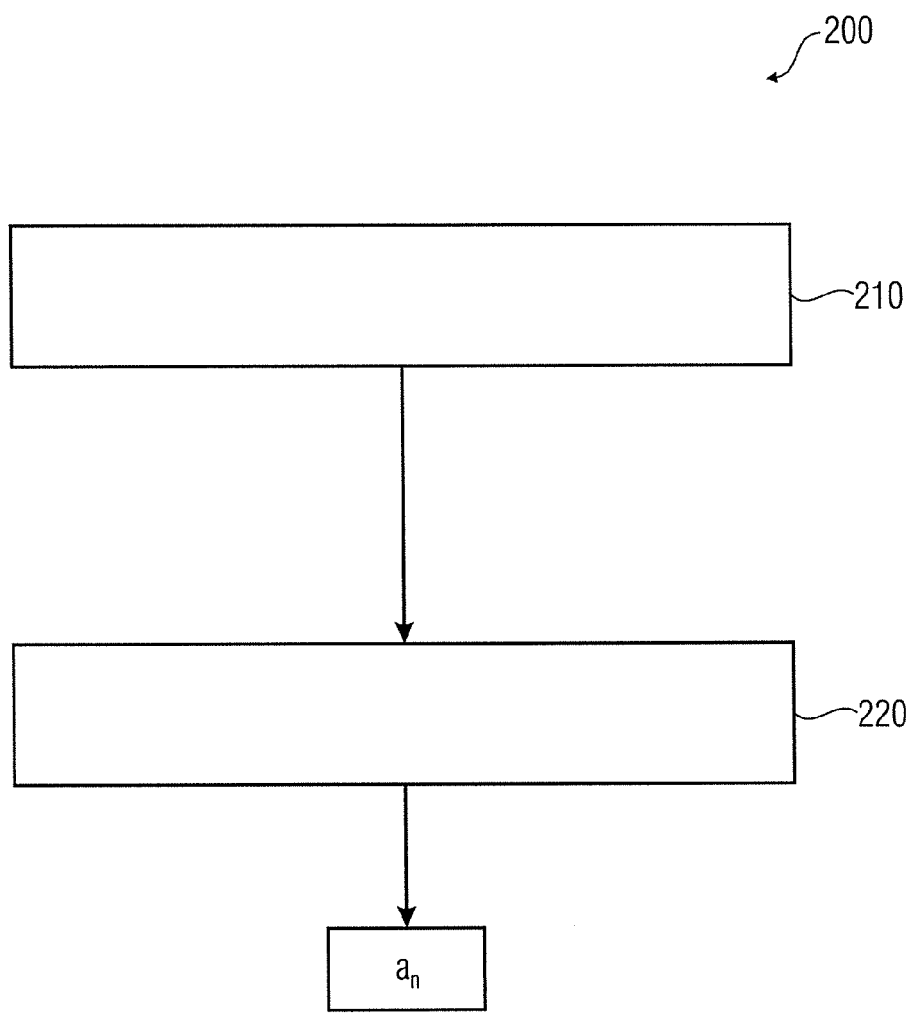
FIG. 4 shows a flowchart illustrating the method for optimizing a transmission function of a noise shaper.

Starting from and including the principles discussed above, a method for designing noise shapers is provided and shown by FIG. 4. FIG. 4 shows a flow chart of the optimizing method 200 comprising the basic steps 210 and 220. The step 210 is electing a first polynomial coefficient $a_1$ and/or a second polynomial coefficient $a_2$ with respect to the useful band, wherein the step 220 is electing one or more further polynomial coefficients ($a_3$ or $a_4$) with respect to one or to both optimization aims "reducing the overall out of band noise" and "limiting the maximum out of band noise". It should be noted that the polynomial coefficients of the second set of polynomial coefficients elected during the step 220 are not equal or are disjoint to the polynomial coefficients of the first set of polynomial coefficients elected during the step 210. The result of the method are the polynomial coefficients $a_n$ of the transfer function $H(z)=\Sigma_{i=1}^{n}a_i z^{-i+1}$. In order to achieve a good optimization result the steps 210 and 220 may be iteratively repeated after simulating the resulting transfer function.

FIG. 5 shows a Fourier transformation of the noise pattern achieved by using different noise shapers having different orders for illustrating the improvements achieved by designing noise shaper filter functions according to the above method. The curve marked by the reference numeral 64a refers to the noise pattern of a $2^{nd}$ order noise shaper, wherein the curve marked by the reference numeral 64b refers to the noise pattern of a $3^{rd}$ order noise shaper.

The above discussed implementations of n-order noise shapers are discussed in context of noise shapers having an order of 4 or 6, wherein it is clear that these aspects also refer to ale noise shapers having an order of at least 3 (e.g. order 5, order 7 or higher) and being designed according to the above design principles.

Although in the above discussion the first set of polynomial coefficients is described as set comprising the first polynomial coefficient $a_1$ and the second polynomial coefficient $a_2$, it should be noted that the first set may also comprise just one polynomial coefficient $a_1$, e.g. in case of for noise shaping at DC. Furthermore, the first set may alternatively be selected such that the filter is optimized to more than one wanted frequency band, i.e. that the transfer function $H(z)=\Sigma_{i=1}^{n}a_i z^{-i+1}$ has more than one zero point. In such cases the first set of polynomial coefficients may have more than the shown two polynomial coefficients $a_1$ and $a_2$, e.g. four polynomial coefficients $a_{1a}, a_{1b}, a_{2a}$ and $a_{2b}$. This example enables noise shaping at two certain frequencies. According to a further example the first set may comprise three polynomial coefficients $a_{1a}, a_{2b}$ and $a_2$ so that the transfer function is optimized to the noise shaping at a certain frequency and to noise shaping at DC.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some implementations, some one or more of the most important method steps may be executed by such an apparatus.

Depending on certain implementation requirements, implementations of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some implementations according to the invention comprise a data carrier having electronically readable control signals, which are capable of cooperating with a programmable computer system, such that one of the methods described herein is performed.

Generally, implementations of the present invention can be implemented as a computer program product with a program code, the program code being operative for performing one of the methods when the computer program product runs on a computer. The program code may for example be stored on a machine readable carrier.

Other implementations comprise the computer program for performing one of the methods described herein, stored on a machine readable carrier.

In other words, an implementation of the inventive method is, therefore, a computer program having a program code for performing one of the methods described herein, when the computer program runs on a computer.

A further implementation of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further implementation of the inventive method is, therefore, a data stream or a sequence of signals representing the computer program for performing one of the methods described herein. The data stream or the sequence of signals may for example be configured to be transferred via a data communication connection, for example via the Internet.

A further implementation comprises a processing means, for example a computer, or a programmable logic device, configured to or adapted to perform one of the methods described herein.

A further implementation comprises a computer having installed thereon the computer program for performing one of the methods described herein.

A further implementation comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some implementations, a programmable logic device (for example a field programmable gate array) may be used to perform some or all of the functionalities of the methods described herein. In some implementations, a field programmable gate array may cooperate with a microprocessor in order to perform one of the methods described herein. Generally, the methods are preferably performed by any hardware apparatus.

The above described implementations are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the implementations herein.

The invention claimed is:

1. An n-order noise shaper circuit with $n \geq 3$, wherein the n-order noise shaper circuit is arranged in a signal path of a transmitter and/or of a receiver of a mobile communication device, and is configured to receive a digital communication signal in a useful frequency band, comprising:
   a signal processor circuit in a forward path of the noise shaper circuit; and
   an n-order feedback filter circuit in a feedback path of the noise shaper circuit to thereby form a feedback loop, wherein the feedback filter circuit is configured to receive an error signal associated with the signal processor circuit and generate a correction signal, wherein the n-order feedback filter circuit comprises a transmission function $H(z) = \Sigma_{i=1}^{n} a_i z^{-i+1}$, wherein $a_i$ comprises polynomial coefficients thereof; and
   a correction circuit configured to adjust the digital communication signal at an input of the signal processor circuit based on the correction signal generated by the n-order feedback filter circuit,
   wherein a first set of polynomial coefficients of the n-order feedback filter circuit are optimized with respect to the useful frequency band,
   wherein a second set of polynomial coefficients are optimized with respect to an optimization aim depending on an overall out of band noise and/or on a maximum out of band noise caused by the signal processor circuit, and
   wherein the useful frequency band and a frequency band associated with the overall out of band noise and/or the maximum out of band noise are different.

2. The n-order noise shaper circuit according to claim 1, wherein the first set of polynomial coefficients comprises a first polynomial coefficient $a_1$ and/or a second polynomial coefficient $a_2$, and wherein the second set of polynomial coefficients comprises one or more further polynomial coefficients.

3. The n-order noise shaper circuit according to claim 1, further comprising a comparison circuit in the feedback loop coupled to an input and an output of the signal processor circuit which is configured to generate the error signal which indicates a deviation of the digital communication signal input to the signal processor from an output signal of the signal processor circuit.

4. The n-order noise shaper circuit according to claim 1, wherein the feedback loop is arranged between the output of the signal processor circuit and the correction circuit arranged at the input of the signal processor circuit.

5. The n-order noise shaper circuit according to claim 1, wherein the feedback filter circuit comprises a feedback filter or a FIR-filter arranged within the feedback loop.

6. The n-order noise shaper circuit according to claim 5, wherein a delay element is arranged between the feedback filter or the FIR-filter and the correction circuit or integrated into the feedback filter or the FIR-filter.

7. The n-order noise shaper circuit according to claim 1, wherein the signal processor circuit comprises a quantizer, a digital to analog converter and/or a digital to time converter.

8. The n-order noise shaper circuit according to claim 1, wherein the signal processor circuit comprises a quantizer coupled to a digital to analog converter at the output.

9. The n-order noise shaper circuit according to claim 1, wherein the comparison circuit is coupled to the output of the signal processor circuit via an analog to digital converter if the signal processor circuit comprises a digital to analog converter and via a time to digital converter if the signal processor circuit comprises a digital to time converter.

10. The n-order noise shaper circuit according to claim 1, wherein no lowpass filter is arranged at an output of the signal processor circuit.

11. The n-order noise shaper circuit according to claim 2, wherein the first polynomial coefficient $a_1$ and/or the second polynomial coefficient $a_2$ are selected such that the transmission function $H(z)=\Sigma_{i=1}^{n} a_i z^{-i+1}$ has a zero at the frequency of the useful band.

12. The n-order noise shaper circuit according to claim 2, wherein the first polynomial coefficient $a_1$ and/or the second polynomial coefficient $a_2$ and the further polynomial coefficients are disjoint to each other.

13. The n-order noise shaper circuit according to claim 1, wherein the transmission function $H(z)=\Sigma_{i=1}^{n} a_i z^{-i+1}$ has an order of four or more.

14. A mobile communication device configured to perform a mobile communication in a signal path comprising a signal processor circuit of a transmitter and comprising an n-order feedback filter circuit that operates as a noise shaper in generating a correction signal in a feedback path that is employed by a correction circuit to adjust a digital communication signal input to the signal processor circuit in the signal path, wherein the n-order feedback filter circuit comprises a transmission function $H(z)=\Sigma_{i=1}^{n} a_i z^{-i+1}$, with $n\geq 3$,
- wherein the first polynomial coefficient $a_1$ and/or the second polynomial coefficient $a_2$ are optimized with respect to a useful frequency band of the digital communication signal in the signal path,
- wherein one or more further polynomial coefficients are optimized with respect to an optimization aim depending on an overall out of band noise and/or on a maximum out of band noise caused by the signal processor circuit,
- wherein the signal processor circuit is coupled to a digital to analog converter or comprises a digital to analog converter in the signal path, and
- wherein the useful frequency band and a frequency band associated with the overall out of band noise and/or the maximum out of band noise are different.

15. A non-transitory computer readable digital storage medium having stored thereon a computer program having a program code for performing, when running on a computer, a method for optimizing a transmission function $H(z)=\Sigma_{i=1}^{n} a_i z^{-i+1}$ of a noise shaper with $n\geq 3$, comprising:
- electing a first polynomial coefficient $a_1$ and/or a second polynomial coefficient $a_2$ with respect to a useful frequency band; and
- electing one or more further polynomial coefficients with respect to an optimization aim depending on an overall out of band noise and/or on a maximum out of band noise,
- wherein the useful frequency band and a frequency band associated with the overall out of band noise and/or the maximum out of band noise are different.

* * * * *